(12) United States Patent
Andrasic et al.

(10) Patent No.: US 7,151,397 B2
(45) Date of Patent: *Dec. 19, 2006

(54) VOLTAGE CONTROLLED OSCILLATOR PROGRAMMABLE DELAY CELLS

(75) Inventors: Stjepan W Andrasic, Burlingame, CA (US); Rakesh H Patel, Cupertino, CA (US); Chong H Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/873,578

(22) Filed: Jun. 22, 2004

(65) Prior Publication Data

US 2005/0024158 A1    Feb. 3, 2005

Related U.S. Application Data

(63) Continuation of application No. 10/099,707, filed on Mar. 13, 2002, now Pat. No. 6,771,105.

(60) Provisional application No. 60/323,249, filed on Sep. 18, 2001.

(51) Int. Cl.
*H03H 11/26* (2006.01)
*H03B 5/24* (2006.01)

(52) U.S. Cl. ............... 327/276; 327/266; 327/280; 331/57

(58) Field of Classification Search ............... None
See application file for complete search history.

(56) References Cited

U.S. PATENT DOCUMENTS 3,473,160 A    10/1969   Wahlstrom ............ 340/172.5
5,121,014 A    6/1992    Huang .................. 307/605
5,208,557 A    5/1993    Kersh, III ............. 331/57
5,477,182 A    12/1995   Huizer .................. 327/261
5,691,669 A    11/1997   Tsai et al. ............. 331/17
5,703,541 A  * 12/1997   Nakashima ............ 331/57

(Continued)

FOREIGN PATENT DOCUMENTS

EP    0 987 822 A2    3/2000
EP    1 056 207 A1    11/2000
JP    10215156        8/1998

OTHER PUBLICATIONS

"ORCA ORT82G5 1.0-1.25/2.0-2.5/3.125 Gbits/s Backplane Interface FPSC", Preliminary Data Sheet, Jul. 2001, Agere Systems Inc., pp. 1-35.
"ORCA ORT8850 Field-Programmable System Chip (FPSC) Eight Channel x 850 Mbits/s Backplane Transceiver", Product Brief, Jul. 2001, Agere Systems Inc., pp. 1-6.

(Continued)

*Primary Examiner*—Tuan T. Lam
(74) *Attorney, Agent, or Firm*—Fish & Neave IP Group Ropes & Gray LLP; Jeffrey C. Aldridge

(57) ABSTRACT

A delay cell has selectable numbers of parallel load resistance transistors operable in parallel, and a similarly selectable number of bias current transistors connectable in parallel. The delay cell is preferably differential in construction and operation. A voltage controlled oscillator ("VCO") includes a plurality of such delay cells connected in a closed loop series. Phase locked loop ("PLL") circuitry includes such a VCO controlled by phase/frequency detector circuitry. The PLL can have a very wide range of operating frequencies as a result of the ability to control the number of load resistance transistors and bias current transistors that are active or inactive in each delay cell. Such activation/deactivation may be programmable or otherwise controlled.

25 Claims, 7 Drawing Sheets

U.S. PATENT DOCUMENTS

| | | | |
|---|---|---|---|
| 5,952,891 A | 9/1999 | Boudry | 331/57 |
| 6,072,372 A * | 6/2000 | Yokoyama | 331/57 |
| 6,144,242 A | 11/2000 | Jeong et al. | 327/269 |
| 6,157,266 A | 12/2000 | Tsai et al. | 331/57 |
| 6,411,150 B1 | 6/2002 | Williams | 327/281 |
| 6,462,623 B1 | 10/2002 | Horan et al. | 331/17 |

OTHER PUBLICATIONS

"ORCA ORT8850 Field-Programmable System Chip (FPSC) Eight-Channel x 850 Mbits/s Backplane Transceiver", Data Sheet, Aug. 2001, Agere Systems Inc., pp. 1-36.

U.S. Appl. No. 09/805,843, filed Mar. 2001, Aung et al.

* cited by examiner

VOLTAGE CONTROLLED OSCILLATOR PROGRAMMABLE DELAY CELLS

This application is a continuation of application Ser. No. 10/099,707 (now U.S. Pat. No. 6,771,105), filed Mar. 13, 2002, which claims the benefit of U.S. provisional patent application No. 60/323,249, filed Sep. 18, 2001. These prior applications are hereby incorporated by reference herein in their entireties.

BACKGROUND OF THE INVENTION

This invention relates to voltage controlled oscillator ("VCO") circuits, and more particularly to voltage controlled oscillator circuits that can be programmed to operate in any of several frequency ranges over a very wide band of such frequency ranges.

Phase locked loop ("PLL") circuitry is frequently used for such purposes as helping to retrieve data from a signal that may vary in frequency and/or phase. The PLL may be in relatively general-purpose circuitry such as a programmable logic device ("PLD") that may need to support signaling at any frequency in a wide range of frequencies. (For examples of PLDs employing PLLS, see Aung et al. U.S. patent application Ser. No. 09/805,843, filed Mar. 13, 2001.) The range of frequencies over which a PLL may be required to operate is steadily increasing, particularly at the upper end (i.e., higher frequencies). At the same time, power supply voltages for integrated circuits are decreasing, making it more difficult to extend the operating range of PLL circuits.

SUMMARY OF THE INVENTION

A delay cell (e.g., for use in the voltage controlled oscillator ("VCO") of a PLL) includes a plurality of load resistance transistors connectable in parallel with one another, a plurality of bias current transistors connectable in parallel with one another, and a switching transistor connected in series between the load resistance transistors and the bias current transistors. Switching circuitry allows the number of the load resistance transistors that are actually operating in parallel to be selected. Other switching circuitry similarly allows the number of the bias current transistors that are actually operating in parallel to be similarly selected. This ability to essentially reconfigure the delay cell allows the operating range (i.e., the time delay characteristic) of the delay cell to be greatly extended. A VCO may include a plurality of such delay cells connected in a closed loop series. The extended operating range of the delay cells similarly greatly extends the operating frequency range of a VCO made up of such cells. The same is true for the operating range of a PLL that includes such a VCO.

The delay cell may be differential in construction and operation.

Further features of the invention, its nature and various advantages will be more apparent from the accompanying drawings and the following detailed description.

DETAILED DESCRIPTION

Figure 1:
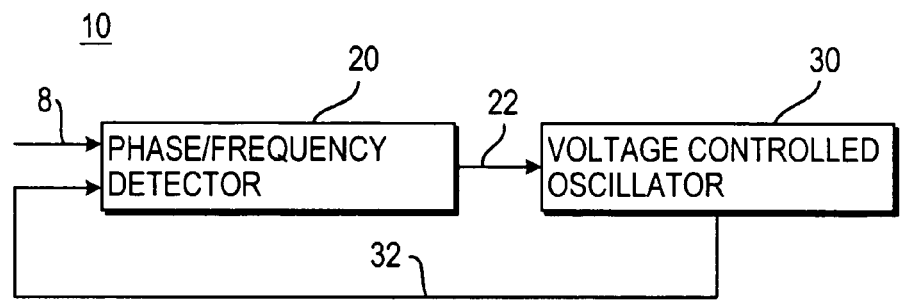
FIG. 1 is a simplified schematic block diagram of an illustrative, conventional, phase locked loop ("PLL") circuit.

In the illustrative, conventional, PLL circuit 10 shown in FIG. 1, phase/frequency detector ("PFD") circuit 20 receives an input signal via input lead 8. Signal 8 is a time-varying signal such as a binary digital signal conveying data represented by different voltage levels and/or by voltage level transitions. PFD 20 compares the phase and frequency of signal 8 to the phase and frequency of a signal fed back to PFD 20 from VCO 30 via lead 32. Based on that comparison, PFD 20 produces one or more output signals 22 for controlling VCO 30 to make the phase and frequency of signal 32 more closely match the phase and frequency of signal 8. For example, signal 8 may be a CDR (clock data recovery) data signal, and PLL 10 may be operated to provide a clock signal recovered from the CDR data signal. (The recovered clock signal can be signal 32 or a signal synchronized with but shifted in phase relative to signal 32, depending on the application.) If PFD 20 detects that signal 32 is too low in frequency or is delayed in phase relative to signal 8, PFD 20 produces an output signal or signals 22 for increasing the frequency of VCO 30. Alternatively, if PFD 20 detects that signal 32 is too high in frequency or is advanced in phase relative to signal 8, PFD 20 produces an output signal or signals 22 for decreasing the frequency of VCO 30.

Figure 2:
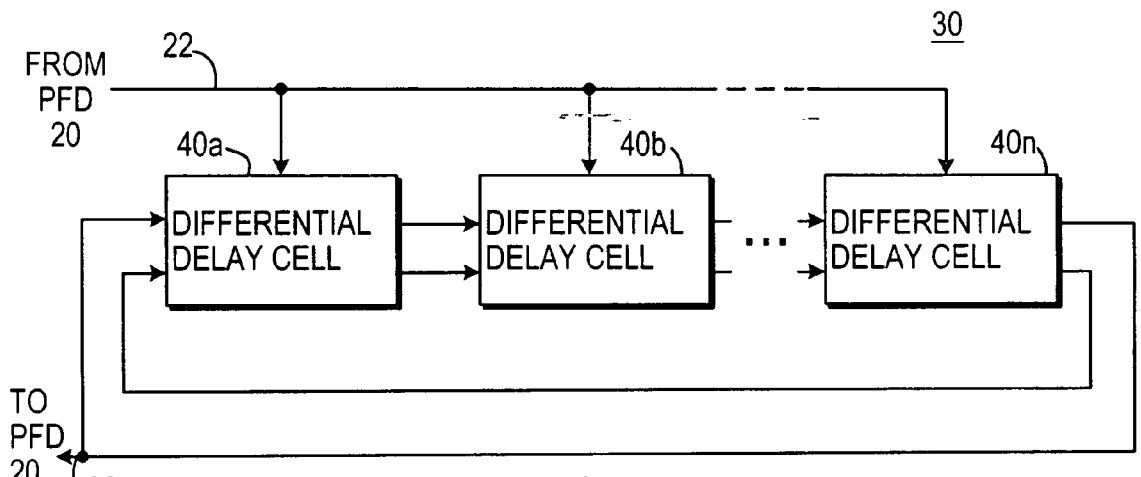
FIG. 2 is a simplified schematic block diagram of an illustrative, conventional, voltage controlled oscillator ("VCO") circuit.

An illustrative construction of VCO 30 is shown in FIG. 2. In this embodiment VCO 30 includes a plurality of differential delay cells 40 connected in a closed loop series. Each delay cell 40 produces transitions in its differential output signals a time delay interval after receiving transitions in the differential signals applied to it from the preceding delay cell in the closed loop series. The time delay interval of each delay cell 40 is variable to at least some degree, with the variation being controlled by the output signal(s) 22 of PFD 20 (FIG. 1). The frequency of oscillation of VCO 30 is inversely proportional to the time delay of delay cells 40. In order for PLL 10 to be able to lock onto any frequency in a wide range of frequencies, VCO 30 must have a correspondingly wide range of oscillation frequencies. This means that delay cells 40 must have a wide range of possible delay time intervals.

Figure 3:
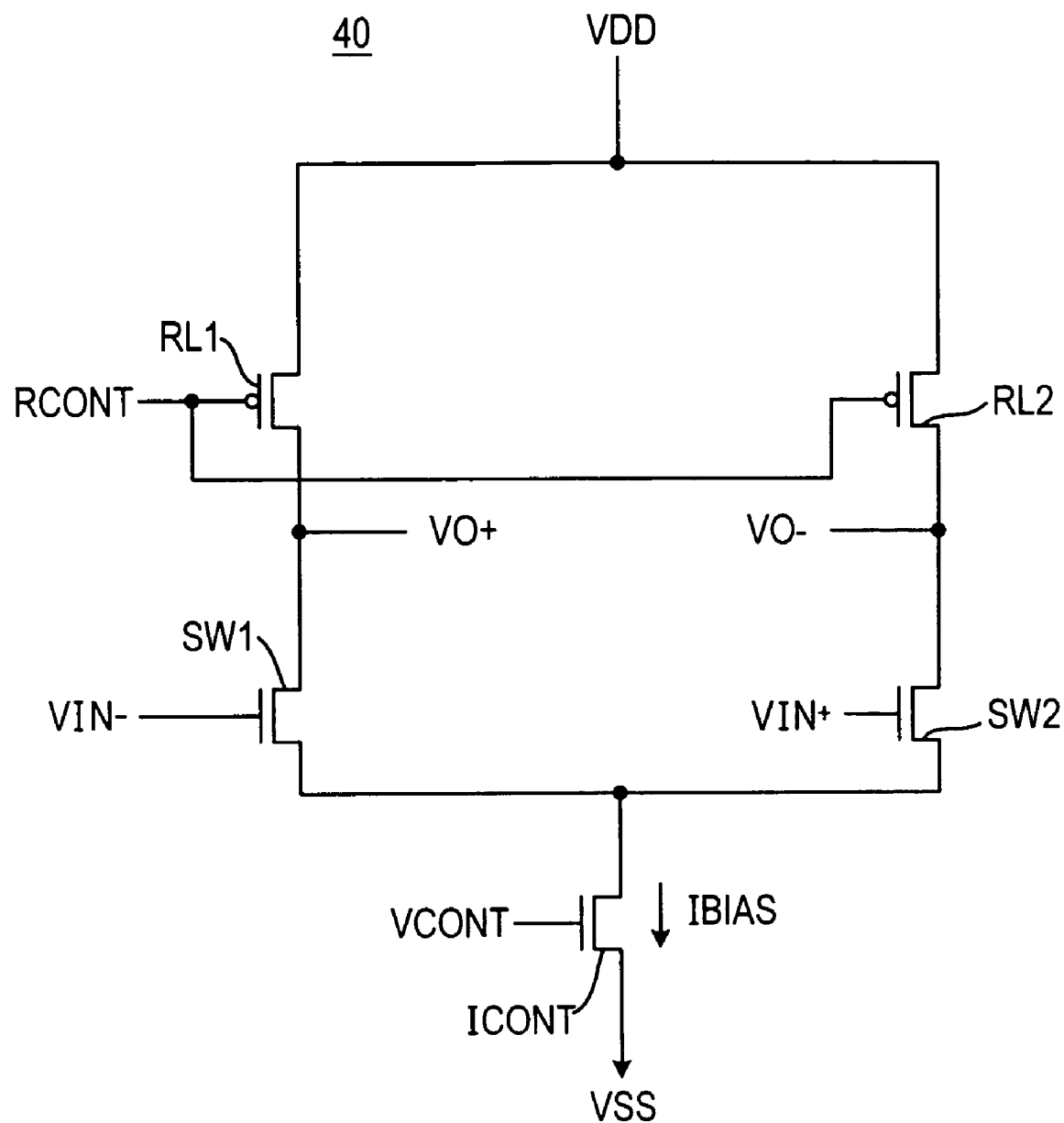
FIG. 3 is a simplified schematic diagram of an illustrative, conventional differential delay cell circuit.

An illustrative construction of one representative delay cell 40 is shown in more detail in FIG. 3. Although FIG. 3 shows a delay cell with PMOSFETs as load resistors RL1 and RL2, and NMOSFETs as input transistors SW1/SW2 and current mirror circuitry IBIAS, it will be understood that similar operation can be achieved with NMOSFETs as load resistors and with PMOSFETs as input transistors and current mirror circuitry.

In the circuitry shown in FIG. 1 RCONT and VCONT are control signals from PFD 20 (FIG. 1). Signals VIN− and VIN+ are differential input signals from the preceding delay cell 40 in the closed loop series (see FIG. 2). Signals VO− and VO+ are differential output signals to the next delay cell 40 in the closed loop series (see again FIG. 2).

The time delay of delay cell 40 is proportional to the resistance of load resistors RL1 and RL2. Therefore, to achieve a wide frequency range, load resistors RL1 and RL2 are varied with RCONT and have a wide resistance range. Also the tail current IBIAS is controlled with VCONT and has a wide current range. The tail current IBIAS is responsible for keeping the output voltage swing constant as load resistance changes. Traditionally, to increase frequency, RCONT is decreased, which increases gate-source bias voltage, thus decreasing resistances RL1 and RL2. At the same time, VCONT is increased, which increases gate-source bias voltage, thus increasing tail current IBIAS. At maximum RL1 and RL2, the load resistance control voltage RCONT starts at VDD−(VSW+|VTP|) and can be decreased until approximately VSS+VDS (assuming that basic current mirroring is used for biasing), at which point RL1 and RL2 are at minimum. VSW is the maximum swing voltage, or VDD−VO, when VO is at its minimum. Current mirror control voltage VCONT starts at VGS, required for minimum current, and can be increased until approximately VDD−VSD (assuming that basic current mirroring is used for biasing), at which point IBIAS is at its maximum.

For both control voltages (i.e., for both RCONT and VCONT) power supply VDD becomes the limiting factor for increasing frequency. Higher bandwidth can be achieved with higher power supply. Unfortunately, the power supply for future integrated circuits is shrinking. This creates a requirement for a different design approach.

In multi-function integrated circuits such as PLDS it is necessary to design PLLs for various high-speed I/O standards with wideband frequency operation. However, as the power supply shrinks, this becomes extremely challenging. The concept of a programmable delay cell in accordance with this invention (see, for example, FIG. 4) solves the need to meet wideband frequency operation in multi-function integrated circuits for such purposes as high-speed communication applications.

Figure 4:
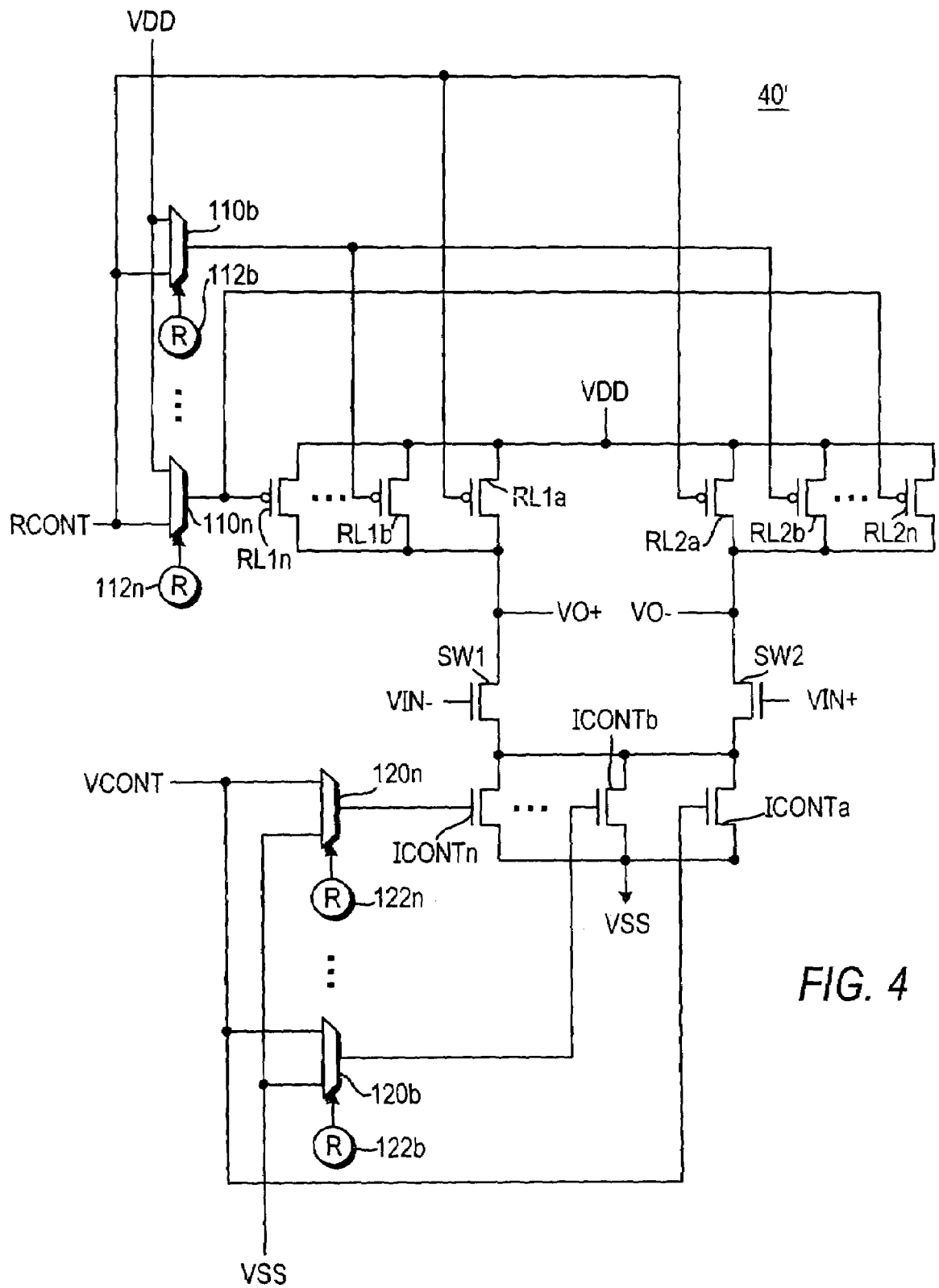
FIG. 4 is a simplified schematic block diagram of an illustrative programmable differential delay cell circuit in accordance with the invention.

The illustrative programmable delay cell 40' in accordance with this invention that is shown in FIG. 4 operates on the same principles as the traditional delay cell, with the addition of an option to turn on a selectable number of extra transistors in parallel with the default devices. For example, load resistor RL1 in FIG. 3 is replaced in FIG. 4 by a plurality of load resistors RL1a, RL1b, . . . , RL1n connected (from source to drain) in parallel with one another. Similarly, load resistor RL2 is replaced by a plurality of load resistors RL2a, RL2b, . . . , RL2n connected (from source to drain) in parallel with one another. The IBIAS transistor ICONT is similarly replaced by a plurality of transistors ICONTa, ICONTb, . . . , ICONTn connected (from source to drain) in parallel with one another. In each case the "a" transistor (i.e., RL1a, RL2a, and ICONTa) is the default device or transistor.

Each transistor (other than the default transistor) in each group of parallel transistors is activated/deactivated via a multiplexer that is controlled by other associated circuitry. For example, RL1b and RL2b are controlled in tandem by the output signal of multiplexer 110b. This multiplexer is controllable to output either VDD (which turns off transistors RL1b and RL2b) or RCONT (which gives RL1b and RL2b exactly the same control as RL1a and RL2a). The latter condition of multiplexer 110b causes RL1a and RL1b to operate in parallel with one another, and similarly causes RL2a and RL2b to operate in parallel with one another. Other multiplexers in the group 110b–110n operate similarly to allow other transistors in the groups RL1b–RL1n and RL2b–RL2n to be selectively added into parallel operation with default transistors RL1a and RL2a.

Multiplexers 120b–120n similarly allow any selectable number of additional transistors ICONTb–ICONTn to be added into parallel operation with default transistor ICONTa. For example, multiplexer 120b is controllable to apply either VSS or VCONT to the gate of transistor ICONTb. Applying VSS deactivates transistor ICONTb. On the other hand, applying VCONT gives transistor ICONTb the same operation as transistor ICONTa.

In the illustrative embodiment shown in FIG. 4, each multiplexer 110/120 is programmably controlled by an associated programmable memory cell 112/122. For example, multiplexer 110b is controlled to output either VDD or RCONT by the programmed state of memory cell 112b. Memory cells like 112/122 are sometimes alternatively referred to herein as function control elements ("FCEs").

Figure 5:
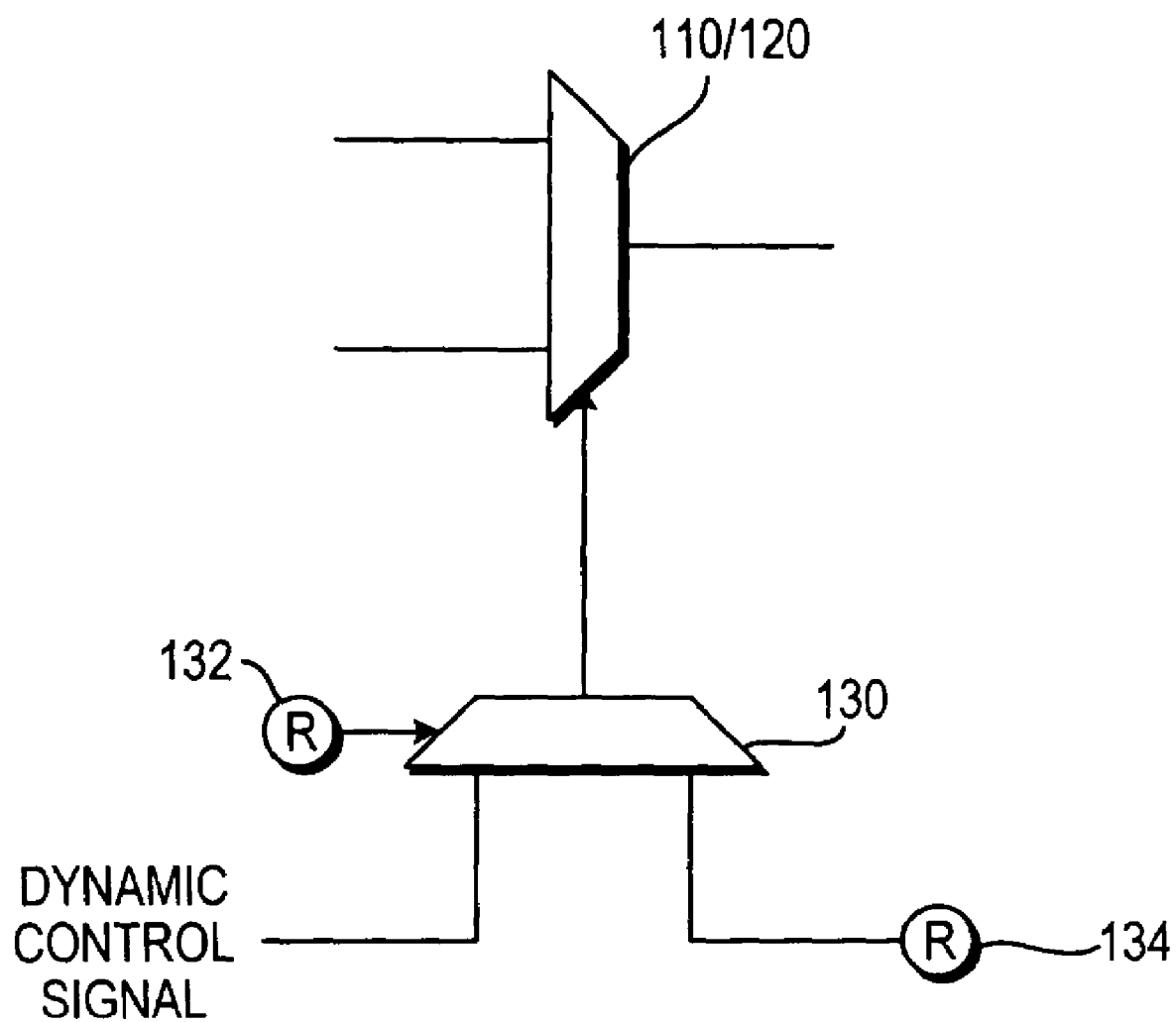
FIG. 5 is a simplified schematic block diagram of an alternative embodiment of a representative portion of what is shown in FIG. 4.

As an alternative to programmable (and therefore typically relatively static) control of multiplexers 110/120, those devices can instead be controlled by other types of signals that can be more dynamic. For example, such more dynamic control signals may come from PFD 20 (FIG. 1) or from logic circuitry elsewhere on a PLD that includes the circuitry of this invention. FIG. 5 shows illustrative circuitry for allowing control of a representative multiplexer 110/120 to be controlled either statically or dynamically. In FIG. 5 multiplexer 110/120 is controlled by the output signal of multiplexer 130. Multiplexer 130 is controlled by the output signal of FCE 132 to output either of the two other input signals that it receives. These two other input signals are a so-called dynamic control signal and the output signal of FCE 134. If multiplexer 130 routes the output signal of FCE 134 to multiplexer 110/120, then multiplexer 110/120 can be controlled to always output either one or the other of its two non-control inputs depending on the programmed state of FCE 134. On the other hand, if multiplexer 130 is controlled by FCE 132 to route the dynamic control signal to multiplexer 110/120, multiplexer 110/120 can be controlled to output one or the other of its two non-control inputs at different times depending on the current logical state of the dynamic control signal.

Circuit elements like 110, 120, and 130 are sometimes referred to herein as programmable logic connectors ("PLCs"), and this PLC terminology may be used without regard for whether the circuitry referred to is programmably or dynamically controlled.

Returning to FIG. 4, all ranges of operation of illustrative programmable differential delay cell 40' (i.e., ranges a-n) have the same operating limits on RCONT and VCONT as the traditional delay cell. Nevertheless, much higher frequencies can be achieved by turning on optional devices (ranges b–n). This is due to the reduced load resistance, which reduces delay cell time as described previously. Extra transistors in the current mirror provide more total tail current IBIAS, which maintains the output swing, while extra load transistors add more resistors in parallel to reduce the load resistance. In the programmable delay cell the load resistance RL becomes a parallel combination of multiple load resistors according to the equation $1/RL = 1/RLa + 1/$ RLb+ . . . +1/RLn. When all resistors are equal with a value of R, then the total resistance is simply R/n, which shows that the load resistance will decrease as more optional transistors are activated. If all resistors are not equal, then the total resistance of an arbitrary number of resistors in parallel is always less than the smallest resistor in the combination.

Figure 6A:
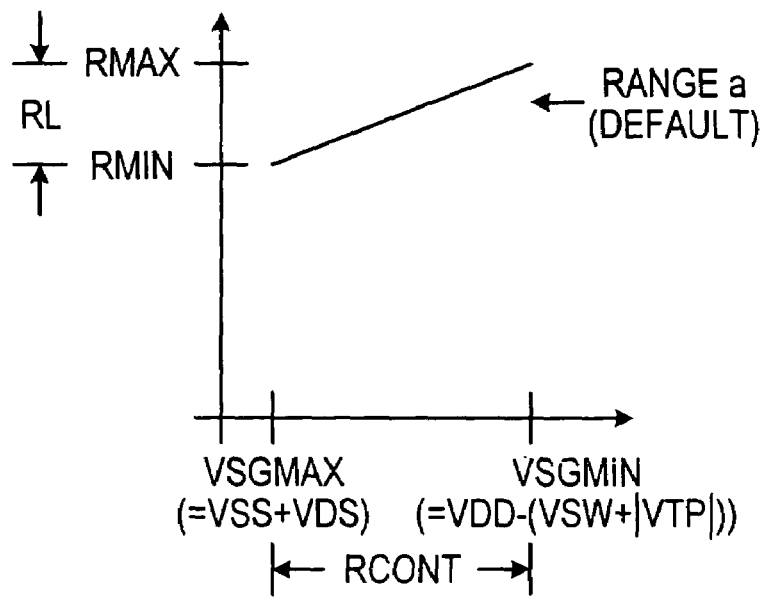
FIG. 6A is a simplified, illustrative, circuit performance diagram useful in explaining certain aspects of the invention.
Figure 6B:
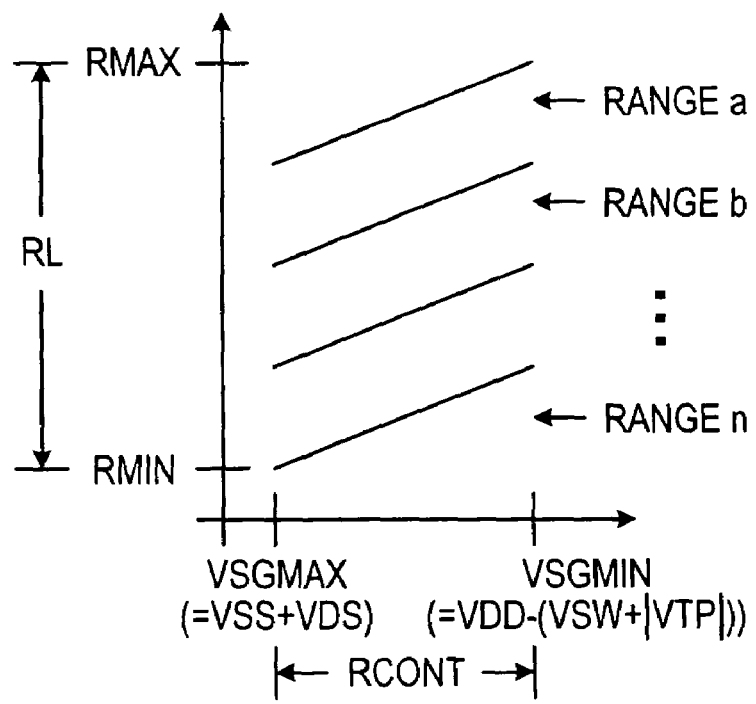
FIG. 6B is similar to FIG. 6A but illustrates the extended range of operation achievable in accordance with the invention.
Figure 7A:
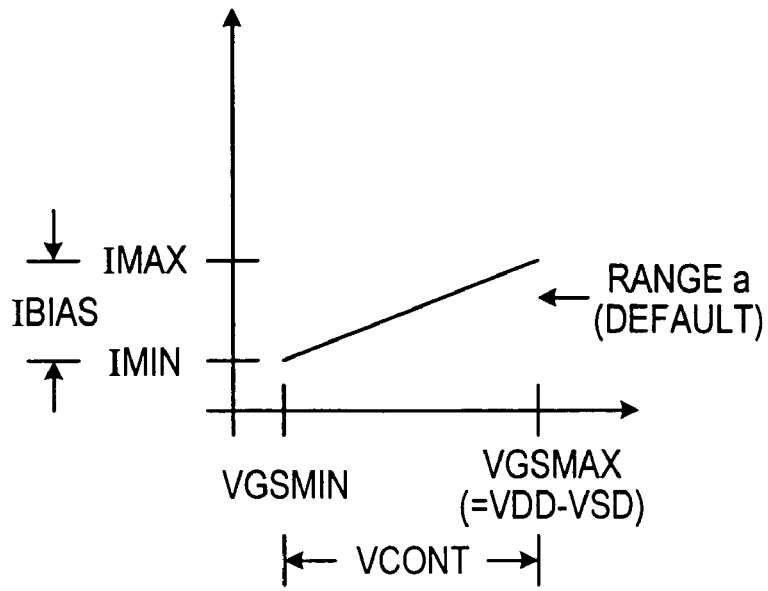
FIGS. 7A and 7B are respectively similar to FIGS. 6A and 6B for other aspects of the invention.
Figure 7B:
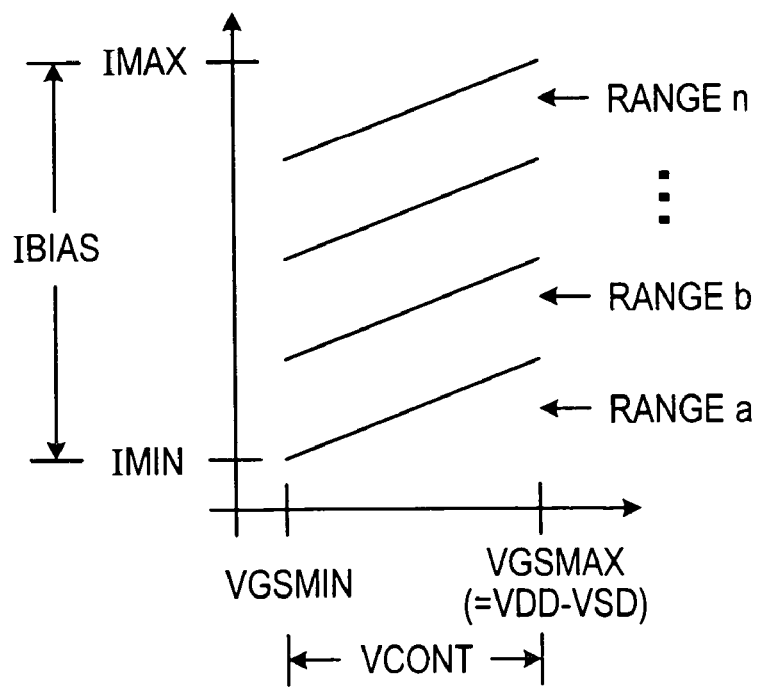

FIGS. 6A and 7A illustrate the relatively limited operating range of a traditional delay cell of the type shown in FIG. 3. FIG. 6A shows that in the traditional load cell the attainable load resistance range is limited by the power supply. Similarly, FIG. 7A shows that in the traditional load cell the tail current range is limited by the power supply. In contrast, FIGS. 6B and 7B illustrate the much greater operating range of the programmable delay cell of this invention (e.g., as in FIG. 4). FIG. 6B shows that in the programmable delay cell (e.g., 40') the attainable load resistance range is limited substantially only by the number of transistors in parallel that are provided by the designer. FIG. 7B illustrates the same point for the attainable tail current range in a programmable delay cell like 40'.

To briefly recapitulate some of the points made above, the operating range needed in a dynamic VCO differential delay cell is a direct product of constantly expanding features of devices such as PLDs (e.g., the need of such devices to operate in multiple, high-speed-serial communications standards). To incorporate standards such as Gigabit Ethernet, Infiniband, and Xaui with older SONET standards, high-speed PLLs have to expand in operating bandwidth from a couple of hundred megahertz to 1–2 GHz. Couple that with the ongoing reduction in integrated circuit power supply, and it becomes difficult or impossible to design wideband PLLs in a traditional manner. The new programmable approach shown and described herein offers a solution that may be especially useful to manufacturers of PLDs. The bandwidth of the PLL including programmable VCO delay cells can be expanded until it encounters physical process limits. However, within these process limits bandwidth is not limited by the power supply, but rather by the design engineer.

Figure 8:
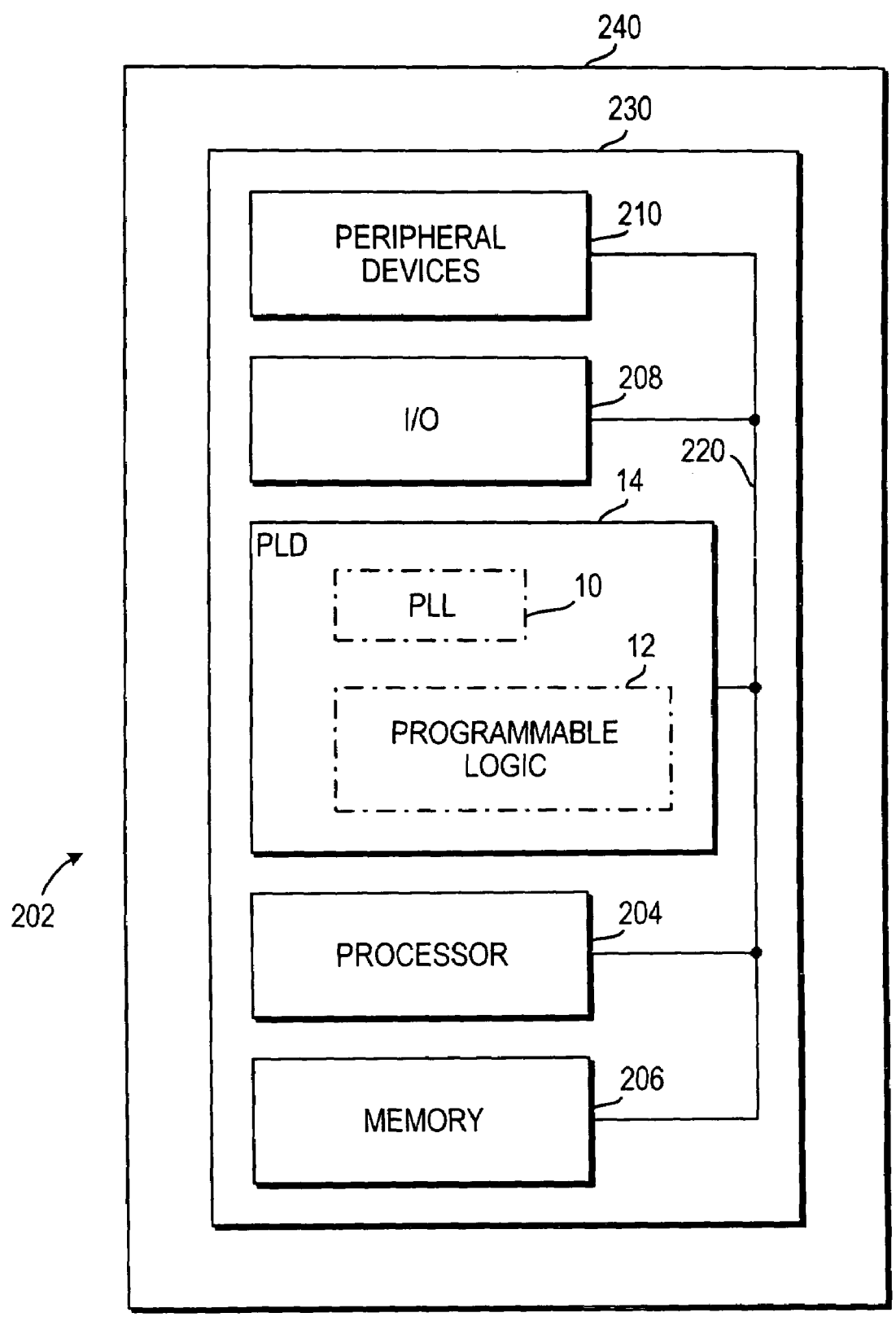
FIG. 8 is a simplified schematic block diagram of an illustrative system employing a PLD that includes PLL circuitry having a VCO that employs delay cells in accordance with the invention.

FIG. 8 shows a programmable logic device ("PLD") 14 (including PLL 10 and programmable logic 12) in a data processing system 202. PLL 10 may be like PLL 10 in FIG. 1, except that it includes in its VCO 30 delay cells constructed in accordance with this invention (e.g., delay cells 40' as shown in FIG. 4). Programmable logic 12 may be conventional and may make use of signal(s) output by PLL 10 and/or may produce signals for controlling certain aspects of the operation of PLL 10 (e.g., controlling PLCs 110 and/or 120 in FIG. 4). Data processing system 202 may also include one or more of the following components: a processor 204; memory 206; I/O circuitry 208; and peripheral devices 210. These components are coupled together by a system bus 220 and are populated on a circuit board 230 that is contained in an end-user system 240.

System 202 can be used in a wide variety of applications, such as computer networking, data networking, instrumentation, video processing, digital signal processing, or any other application where the advantage of using programmable or reprogrammable logic is desirable. Programmable logic device 14 can be used to perform a variety of different logic functions. For example, programmable logic device 14 can be configured as a processor or controller that works in cooperation with processor 204. Programmable logic device 14 may also be used as an arbiter for arbitrating access to a shared resource in system 202. In yet another example, programmable logic device 14 can be configured as an interface between processor 204 and one of the other components in system 202. It should be noted that system 202 is only exemplary, and that the true scope and spirit of the invention should be indicated by the following claims.

Various technologies can be used to implement programmable logic devices 14 in accordance with this invention, as well as the various components of those devices (e.g., the above-described PLL and programmable logic circuitries 10 and 12 and circuit elements like PLCs and FCEs that may be used therein). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, although FIG. 4 at least pictorially implies that the sources of the control signals for PLCs 110, on the one hand, and PLCs 120, on the other hand, are separate, common or shared control may be used if desired. Such common or shared control would typically mean that the same control would be used for PLCs 110b and 120b, that the same control would be used for PLCs 110c and 120c, etc. As another example of modifications within the scope of the invention, any number of parallel transistors can be included in each group RL1a–n, RL2a–n, and ICONTa–n. Although differential delay cells are generally preferred, the invention can also be applied to non-differential delay cells. For example, such a non-differential delay cell would have only one switching transistor SW1 or SW2, and only one set of load resistor transistors RL1a–n or RL2a–n. In other respects, such a non-differential delay cell can be constructed as shown, for example, in FIG. 4.

The invention claimed is:

1. A variable delay cell comprising:
   a plurality of load resistance transistors connectable in parallel with one another;
   a plurality of bias current transistors connectable in parallel with one another;
   a switching transistor connected in series between the plurality of load resistance transistors and the plurality of bias current transistors; and
   switching circuitry that selectively operatively connects at least one of the load resistance transistors in parallel with at least one other of the load resistance transistors, wherein the switching circuitry selectively applies either a disabling control signal or a variable control signal to the at least one of the load resistance transistors.

2. The variable delay cell defined in claim 1 wherein the variable control signal is also used to control the at least one other of the load resistance transistors.

3. A variable delay cell comprising:
a plurality of load resistance transistors connectable in parallel with one another;
a plurality of bias current transistors connectable in parallel with one another;
a switching transistor connected in series between the plurality of load resistance transistors and the plurality of bias current transistors;
switching circuitry that selectively operatively connects at least one of the load resistance transistors in parallel with at least one other of the load resistance transistors; and
further switching circuitry that selectively operatively connects at least one of the bias current transistors in parallel with at least one other of the bias current transistors, wherein the further switching circuitry selectively applies either a deactivating control signal or a variable activating control signal to the at least one of the bias current transistors.

4. The variable delay cell defined in claim 3 wherein the variable activating control signal is also used to control the at least one other of the bias current transistors.

5. A programmable differential delay cell comprising:
a plurality of first load resistance transistors connectable in parallel with one another;
a plurality of bias current transistors connectable in parallel with one another;
a first switching transistor connected in series between the plurality of first load resistance transistors and the plurality of bias current transistors;
first switching circuitry that selectably connects at least a first one of the first load resistance transistors in parallel with at least one other of the first load resistance transistors; and
second switching circuitry that selectably connects at least a first one of the bias current transistors in parallel with at least one other of the bias current transistors, wherein the first switching circuitry selectively applies either a disabling control signal or a variable control signal to the at least a first one of the first load resistance transistors.

6. The programmable differential delay cell defined in claim 5 further comprising:
a plurality of second load resistance transistors connectable in parallel with one another; and
a second switching transistor connected in series between the plurality of second load resistance transistors and the plurality of bias current transistors.

7. The programmable differential delay cell defined in claim 6 further comprising:
input circuitry that respectively applies first and second differential input signals as control signals to the first and second switching transistors.

8. The programmable differential delay cell defined in claim 6 further comprising:
output circuitry that respectively derives first and second differential output signals from electricity flow controlled by the first and second switching transistors.

9. Voltage controlled oscillator circuitry comprising:
a plurality of programmable differential delay cells as defined in claim 7 connected in a closed loop series in which the input signals of each cell are the output signals of a preceding cell in the series.

10. Phase locked loop circuitry comprising:
voltage controlled oscillator circuitry as defined in claim 9; and
phase/frequency detector circuitry that compares phase and frequency of a signal in the voltage controlled oscillator circuitry to phase and frequency of a time-varying input signal in order to produce output control signals for at least partly controlling the first and second load resistance transistors and the bias current transistors.

11. A programmable logic device comprising:
phase locked loop circuitry as defined in claim 10.

12. The programmable logic device defined in claim 11 further comprising:
programmable logic circuitry that makes use of a signal produced as a result of operation of the phase locked loop circuitry.

13. A digital processing system comprising:
processing circuitry;
a memory coupled to said processing circuitry; and
a programmable logic device as defined in claim 12 coupled to the processing circuitry and the memory.

14. A printed circuit board on which is mounted a programmable logic device as defined in claim 12.

15. The printed circuit board defined in claim 14 further comprising:
a memory mounted on the printed circuit board and coupled to the programmable logic device.

16. The printed circuit board defined in claim 14 further comprising:
processing circuitry mounted on the printed circuit board and coupled to the programmable logic device.

17. The programmable differential delay cell defined in claim 5, wherein the first switching circuitry is a programmable logic connector.

18. The programmable differential delay cell defined in claim 5, wherein the second switching circuitry is a programmable logic connector.

19. The programmable differential delay cell defined in claim 5, wherein the first switching circuitry is programmable.

20. The programmable differential delay cell defined in claim 5, wherein the second switching circuitry is programmable.

21. The programmable differential delay cell defined in claim 5 further comprising:
third switching circuitry that selectably connects at least a second one of the first load resistance transistors in parallel with the at least one other of the first load resistance transistors.

22. The programmable differential delay cell defined in claim 5 further comprising:
fourth switching circuitry that selectably connects at least a second one of the bias current transistors in parallel with the at least one other of the bias current transistors.

23. The programmable differential delay cell defined in claim 6, wherein the first switching transistor and the second switching transistor are respectively controlled by complementary input signals.

24. The programmable differential delay cell defined in claim 6, wherein the first switching circuitry selectably connects at least a first one of the second load resistance transistors in parallel with at least one other of the second load resistance transistors.

25. A programmable differential delay cell comprising:
a plurality of first load resistance transistors connectable in parallel with one another;
a plurality of bias current transistors connectable in parallel with one another;
a first switching transistor connected in series between the plurality of first load resistance transistors and the plurality of bias current transistors;
first switching circuitry that selectably connects at least a first one of the first load resistance transistors in parallel with at least one other of the first load resistance transistors; and
second switching circuitry that selectably connects at least a first one of the bias current transistors in parallel with at least one other of the bias current transistors, wherein the second switching circuitry selectively applies either a disabling control signal or a variable control signal to the at least a first one of the bias current transistors.

* * * * *